(12) United States Patent
Paumier et al.

(10) Patent No.: US 7,853,854 B2
(45) Date of Patent: Dec. 14, 2010

(54) ITERATIVE DECODING OF A FRAME OF DATA ENCODED USING A BLOCK CODING ALGORITHM

(75) Inventors: Laurent Paumier, Grenoble (FR); Pascal Urard, Theys (FR); Vincent Heinrich, La Tronche (FR)

(73) Assignee: STMicroelectronics SA, Montrouge (FR)

( * ) Notice: Subject to any disclaimer, the term of this patent is extended or adjusted under 35 U.S.C. 154(b) by 1064 days.

(21) Appl. No.: 11/560,316

(22) Filed: Nov. 15, 2006

(65) Prior Publication Data

US 2007/0198895 A1      Aug. 23, 2007

(30) Foreign Application Priority Data

Nov. 15, 2005    (FR) .................................. 05 11572

(51) Int. Cl.
*H03M 13/00*    (2006.01)
(52) U.S. Cl. ...................... 714/755; 714/758; 714/801; 714/794
(58) Field of Classification Search ................ 714/755, 714/758, 794, 801, 807, 800
See application file for complete search history.

(56) References Cited

U.S. PATENT DOCUMENTS

| | | | | |
|---|---|---|---|---|
| 6,518,892 | B2 | 2/2003 | Shen et al. ...................... 341/50 |
| 6,888,901 | B2 | 5/2005 | Yu et al. ...................... 375/341 |
| 7,281,192 | B2 * | 10/2007 | Shen et al. .................. 714/757 |
| 7,464,316 | B2 * | 12/2008 | Bickerstaff et al. ......... 714/755 |
| 7,533,320 | B2 * | 5/2009 | Bass ........................... 714/755 |
| 2004/0140915 | A1 | 7/2004 | Shen et al. ..................... 341/50 |
| 2005/0078765 | A1 * | 4/2005 | Jeong et al. ................. 375/267 |

OTHER PUBLICATIONS

Isaka, M., et al., "On the Suboptimality of Iterative Decoding for Turbo-Like and LDPC Codes with Cycles in their Graph Representation," IEEE Transactions on Communications, 52(5), May 2004, pp. 845-854.
MacKay, D., "Good Error-Connecting Codes Based on Very Sparse Matrices," IEEE Transactions on Information Theory, 45 (2), Mar. 1999, pp. 399-431.
Mao, Y., et al., "Codes on Graphs and Iterative Decoding: A Study Through Low-Density Parity-Check Codes," Sep. 6, 2003, 8 pages.
Shao, R., et al., "Two Simple Stopping Criteria for Turbo Decoding," IEEE Transactions on Communications, 47(8), Aug. 1999, pp. 1117-1120.

* cited by examiner

*Primary Examiner*—Fritz Alphonse
(74) *Attorney, Agent, or Firm*—Lisa K. Jorgenson; Timothy L. Boller; Seed IP Law Group PLLC

(57) ABSTRACT

A method for the iterative decoding of a block of bits having a number N of bits to be decoded where N is a whole number greater than or equal to two, using an iterative decoding algorithm, comprises the generation of a current block of N intermediate decision bits by executing an iteration of the decoding algorithm, followed by the verification of a stability criterion for the current block by comparison of the current block with a given block of N reference bits. If the stability criterion is satisfied, the iterations of the iterative decoding algorithm are stopped and the current block of intermediate decision bits is delivered as a block of hard decision bits. Otherwise another iteration of the decoding algorithm is executed.

42 Claims, 7 Drawing Sheets

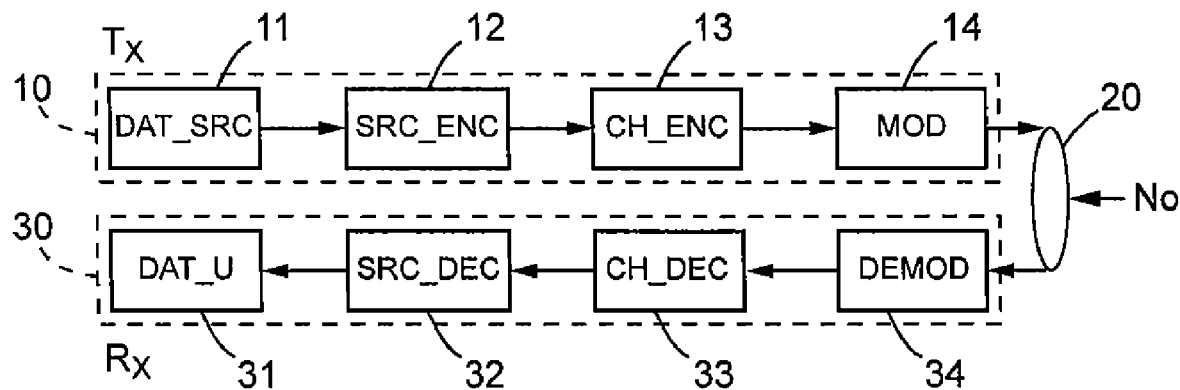

ITERATIVE DECODING OF A FRAME OF DATA ENCODED USING A BLOCK CODING ALGORITHM

TECHNICAL FIELD

The present disclosure generally concerns the iterative decoding of data encoded using a block coding algorithm.

It has applications particularly but not exclusively in devices for receiving signals transmitted by satellite, for example using the satellite digital video broadcasting standard DVB-S2, which stipulates the use of a low density parity check ("LDPC") code to protect the data transmission.

BACKGROUND INFORMATION

LDPC codes are a class of error correction codes invented in 1960 by Robert Gallager of MIT ("Massachusetts Institute of Technology"), constituting an alternative to the Viterbi codes as well as to the more recent turbo codes. LDPC codes are block codes which allow approaching the Shannon Limit. The first commercial standard stipulating the use of an LDPC code is the DVB-S2 standard, which is the second-generation ETSI ("European Telecommunication Standardization Institute") standard for satellite digital video broadcasting. LDPC coding is included in it for channel coding, to protect the sent data from noise affecting the transmission channel.

With reference to FIG. 1, a generic transmission subsystem contains, on the side of the transmitter 10, a data source 11 (denoted DAT_SRC in the figure), followed by a source encoder 12 (denoted SCR_ENC in the figure), a channel encoder 13 (denoted CH_ENC in the figure), and a modulator 14 (denoted MOD in the figure). The source encoder 12 compresses the data (for example using a standard such as MPEG, H264, etc.) so as to reduce the bit rate of the data to be transmitted. The channel encoder adds redundancy (for example by using an LDPC code) to enable the receiver 30 to correct potential errors due to the noise No introduced into the transmission channel 20. The modulator 14 adapts the signal to the transmission channel (for example, satellite transmission channel, radio transmission channel, etc.). On the receiver side 30, a demodulator 34 (denoted DEMOD in the figure), followed by a channel decoder 33 (denoted CH_DEC in the figure), and a source decoder 32 (denoted SRC_DEC in the figure), perform operations dual to those performed by the modulator 14, the encoder 13, and the encoder 12, respectively. The demodulated and decoded data are then restored to the entity that uses the data 31 (denoted DAT_U in the figure).

LDPC codes are block codes. On the transmitter side, the LDPC encoder processes blocks of K information bits, and outputs code words of N bits, also called LDPC frames, where N>K. In other words, it adds N−K redundancy bits which enable the correction of transmission errors on the receiver side. These N−K bits are called parity bits. The code rate is defined as the ratio r=K/N. The smaller the r, the higher the redundancy, and therefore the higher the protection against noise in the transmission channel.

The N−K bits added to each block of K information bits are calculated using an H matrix, called the parity check matrix. This H matrix has N−K rows and N columns. It contains "0" and "1" values, with the latter in low proportions, which is why codes based on such a parity matrix are called low density parity check codes.

With reference to FIG. 2, an N-bit LDPC frame, in which the K low order bits correspond to the information bits and the N−K high order bits correspond to the parity bits, is the code word C delivered by an LDPC encoder which satisfies the relation:

$$H \times C^t = 0 \quad (1)$$

The check node degree for a row in the H matrix is the number of "1" values in the row, and the bit node degree for a column in the H matrix is the number of "1" values in the column. There exist two types of LDPC code: regular codes and irregular codes. The H matrix for a regular code has a constant number of "1" values per row and per column, meaning that the check node degrees and bit node degrees are constant. Conversely, the H matrix for an irregular code does not have constant check node degrees and/or bit node degrees, and is therefore more random in character. The best performance is obtained with irregular codes, but the decoding may then be more difficult. The DVB-S2 standard recommends the use of an H matrix which has constant check node degrees of between 4 and 30 (abbreviated as the matrix check node degree), and bit node degrees which may assume three values between 2 and 13.

On the receiver side, the LDPC decoder corrects the erroneous bits by using the relations between the bits in the LDPC frames received through the transmission channel, corresponding to a block of bits C'. These relations are given by the parity check matrix H, which is also known to the decoder.

To this effect, the errors in the received block of bits C' are corrected by applying an iterative algorithm so that the corrected block of bits C' satisfies the relation:

$$C' \times H^t = 0 \quad (2)$$

More particularly, the LDPC decoder processes likelihood ratios, for example log-likelihood ratios (LLRs). On the receiver side, there is an LLR for each of the N bits of an LDPC frame which was sent from the transmitter. For a transmitted bit d which has a corresponding signal x received by the LDPC decoder after noise is added to the transmission channel, the LLR ratio for the bit d in relation to the signal x is defined as:

$$LLR(x) = LLR(d/x) = \ln\frac{P(d=0/x)}{P(d=1/x)}$$

where $P(d=0/x)$ is the probability that the transmitted bit d is equal to 0 as a function of the value x received, and $P(d=1/x)$ is the probability that the transmitted bit d is equal to 1 as a function of the value x received. Each LLR is coded in m bits. For example, an LLR assumes negative or positive values of greater absolute value as the probability that the received bit with which it is associated is equal, for example, to 0 or 1 respectively.

The LDPC decoder uses internal metrics, equal in number to the number of "1" values in the H matrix. These metrics are each coded in t bits. The decoder updates them using an iterative algorithm.

With reference to FIG. 3, each iteration comprises update steps performed by row, comprising determining for each row the first new values for the internal metrics of the row as a function of the other internal metrics of the row ("check node update"), then update steps performed by column, comprising determining for each column the second new values for the internal metrics of the column as a function of the other internal metrics of the column and the LLR corresponding to this column ("bit-node update"). To decode a received LDPC frame, the decoder performs several iterations in order to restore a block of N data sent. The decoded bits, called hard decision bits, are then obtained by adding the internal metrics by column with the LLRs for the C' block received, and taking the sign of the result.

In traditional decoders, a given number of iterations of the iterative encoding algorithm are executed before the hard decision bits are obtained. This number is set in advance to a value considered to be sufficient to guarantee satisfactory decoding under any transmission conditions.

In FIG. 4, the top graph shows the curve 410 giving the Binary Error Rate ("BER") observed on the receiver side as a function of the signal-to-noise ratio ("SNR") in decibels (dB) defined on the transmitter side. The bottom graph shows the curve 420 graphing the power PWR in watts (W) used by the decoder on the receiver side as a function of the SNR of the transmission.

A peak 421 is observed in the power consumption of the decoder in the waterfall region 411 of the BER, followed by a plateau 422 in the decoder consumption. The operating range is located to the right of a vertical line 412 which marks the end of the waterfall region of the BER, where the BER is sufficiently low to guarantee the quality of the reception. For an SNR value corresponding to said vertical line 412, the value of the power consumed PWR is close to the value of the plateau 422.

Currently there is an attempt to reduce the amount of power used by the decoder, in order to push back the limits this imposes on greater silicon integration of systems incorporating it. In other words, the attempt is to reduce the value of the consumption plateau for a given SNR ratio.

One solution for limiting decoder consumption would include stopping the iterations of the iterative decoding algorithm as soon as the above relation (2) is satisfied. This would save the power corresponding to superfluous iterations in the decoding algorithm. The number of iterations would therefore be variable, corresponding to the minimum number of iterations required to obtain satisfactory decoding under actual transmission conditions.

Advantageously, the decoding would also be faster, which would be valuable in certain applications. However, implementation of this solution requires the use of hardware comprising RAM memory (Random Access Memory) having a storage capacity of several tens of kilobits (Kbits), a mixer for translating the structure of the H matrix, and ROM memory (Read Only Memory) for storing the location of the "1" values in the H matrix in order to allow controlling the mixer and managing the RAM read/write addresses. This hardware occupies a silicon surface area of approximately 0.4 to 0.5 mm$^2$ in 90 nm CMOS technology. In addition, with this solution it is difficult to use the equivalent hardware resources already present in a traditional decoder, without complicating it to a dissuasive extent.

BRIEF SUMMARY

This is why an embodiment of the invention allows reducing the power consumption of a decoder performing the iterative decoding of data encoded using a block coding algorithm, such as an LDPC code, by offering another criterion for stopping the iterations.

For this purpose, a first aspect of the invention proposes a method for the iterative decoding of a block of bits comprising a number N of bits to be decoded where N is a whole number greater than or equal to two, where said method is implemented by a decoder having an input memory and/or an output memory and using an iterative decoding algorithm. The process comprises:

/a/ the generation of a current block of N intermediate decision bits by executing an iteration of the iterative decoding algorithm, followed by /b/ the verification of a stability criterion for said current block, evaluated over a number Q of prior iterations of the iterative decoding algorithm where Q is a whole number greater than or equal to one, and by comparison of the current block with at least one given block of N reference bits read from the input memory or output memory of the decoder, and /c/ if the stability criterion is satisfied, the stopping of the iterations of the iterative decoding algorithm and the delivery of the current block of intermediate decision bits as the block of hard decision bits, /d/ else return to /a/.

With one embodiment of the invention, the superfluous iterations in the iterative decoding algorithm are avoided, which allows decreasing the power consumption in the decoder and reducing the decoding time.

Advantageously in one embodiment, the reference bits are stored in the input memory or the output memory of the decoder, such that the embodiment does not require memory resources in addition to those already present in standard decoders.

As a result, the supplemental silicon surface area required to implement any of the embodiments described in the present document is very small.

A second aspect of the invention relates to an iterative decoding device comprising a means for implementing the process according to the first aspect.

A third aspect of the present invention relates to a computer program product comprising instructions to implement the process according to one of the above embodiments when it is loaded and executed in an iterative decoding device according to the second aspect.

A fourth aspect of the invention concerns a system comprising an iterative decoding device according to the second aspect. Such a system may be implemented in the form of a System on Chip ("SoC"), meaning it is integrated into a single integrated circuit package.

A fifth aspect of the invention relates to a satellite transmission receiver comprising a system according to the second aspect.

BRIEF DESCRIPTION OF THE SEVERAL VIEWS OF THE DRAWINGS

Other features of one or more embodiments of the invention will become apparent in reading the following description. This is purely illustrative and non-limiting, and should be read with reference to the attached drawings, in which:

FIG. 1, previously described, is a diagram illustrating a generic data transmission subsystem, FIG. 2, also previously described, shows an example of a parity check matrix and illustrates its application in an LDPC frame, FIG. 3, also previously described, illustrates the calculations for updating check nodes and bit nodes, performed with the aid of the parity check matrix of FIG. 2.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the invention are given below for the case of data encoded using an LDPC code.

An LDPC decoder of one embodiment is an iterative decoder. In addition, LDPC coding uses a block coding algorithm and therefore the decoder processes blocks of bits. Due to this fact, the decoder comprises an input memory, or channel memory, for storing the data to be decoded. This memory may comprise a first single port storage element configured for storing a block of bits corresponding to a previously received code word which is currently being decoded, and a second single port storage element configured for storing another block of bits corresponding to a code word currently being received. The processes of receiving and decoding may thus be simultaneous. To avoid the input memory of the decoder becoming full, the block decoding time is less than the block receiving time in one embodiment. In order to have the highest possible bit rate, the block receiving time is as low as possible in one embodiment. Therefore, as a general rule, the block decoding time is close to the block receiving time while being less than this receiving time.

In addition, the decoder comprises an output memory, or hard decision memory, in which is stored a block of bits decoded after complete processing of a block of data received as input for decoding. In standard decoders, the block of decoded bits is in principle stored in the output memory until it is overwritten by the next block of decoded bits.

An embodiment of the present invention proposes using one and/or the other of the input memory and output memory of the decoder, for storing a block of reference bits used to verify a stability criterion over time (meaning from one iteration to the next) for a block of intermediate decision bits updated at each iteration in the decoding of a given block of bits to be decoded.

Figure 4:
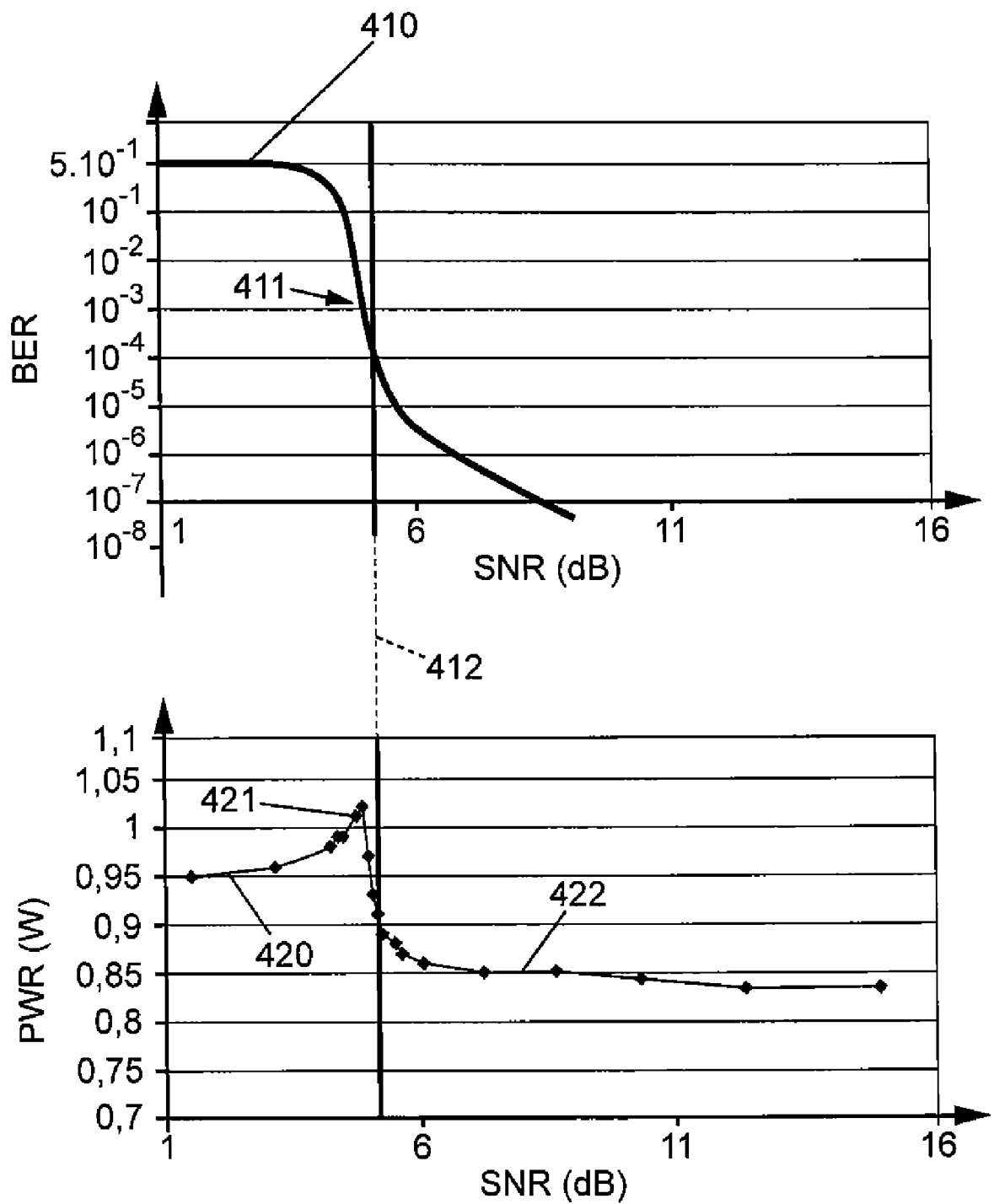
FIG. 4 shows respective graphs of the bit error rate and the power consumed in an example iterative decoder, as a function of the signal-to-noise ratio of the signal transmitted.
Figure 5:
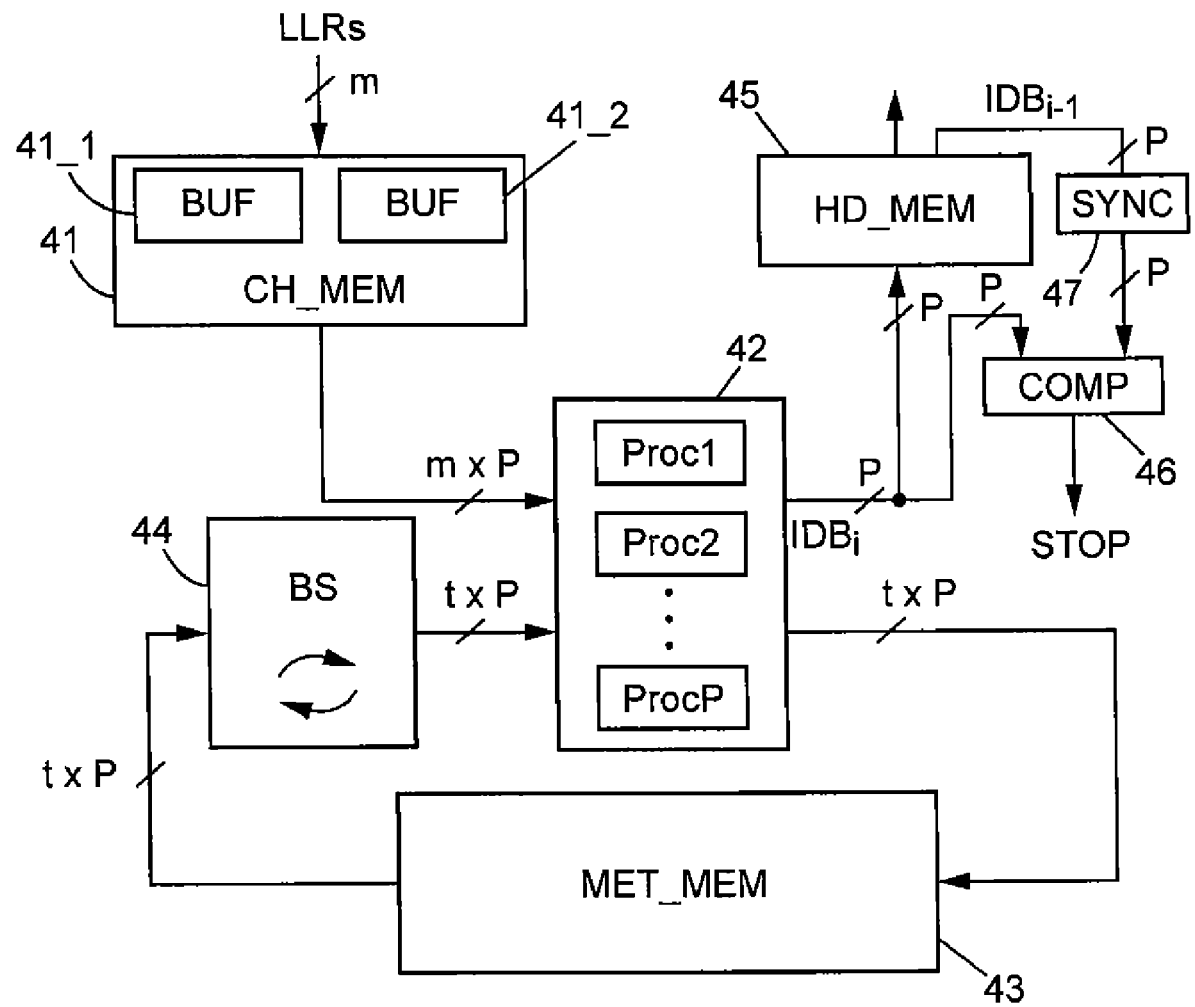
FIG. 5 is a architecture diagram for an iterative decoder according to embodiments of the invention.

With reference to FIG. 5, one example of the architecture of an LDPC decoder according to embodiments of the invention comprises an input memory or channel memory 41 (denoted CH_MEM in the figure) which can store blocks of information bits to be decoded corresponding to two LDPC frames sent from the transmitter. These information bits correspond to a number 2×N of LLRs.

More particularly, the memory 41 comprises at least two single port storage elements 41_1 and 41_2. Each of these storage elements is configured for storing a block of information bits to be decoded, with such a block indicating here the unit of data processed by the iterative decoding algorithm. In other words, each of the storage elements 41_1 and 41_2 is configured for storing a block of N×m bits corresponding to the N LLRs associated with a previously received word which is currently being decoded, or a block of N×m bits corresponding to the N LLRs associated with a code word currently being received.

For example, the storage elements 41_1 and 41_2 are single port RAM ("SPRAM"), each forming a buffer.

In order to accelerate the calculations related to decoding, the decoding unit comprises a bank 42 of P processors, comprising a number P of parallel processors (denoted Proc1 to ProcP in the figure) which perform in parallel the calculations for the check nodes and bit nodes. The number P is called the parallelism index. The processor bank 42 has read access to the input memory 41 via a bus of m×P wires.

During execution of the iterative process, the processors deliver updated values of internal metrics, each coded in t bits. The internal metrics are stored in a metric memory 43 (denoted MET_MEM in the figure), which has a capacity equal to t times the number of metrics (meaning t times the number of "1" values in the H matrix). The internal metrics stored in the memory 43 are delivered to the processor bank 42 via a P-channel mixer, such as a barrel shifter 44 (denoted BS in the figure) in the case of the DVB-S2 standard. The memory 43 is read and write accessible via respective buses of t×P wires.

After the last iteration, the processor bank 42 also, in a known manner, delivers hard decision bits which assume the values "1" or "0" depending on the sign of the sum of the columns of the H matrix and the LLRs for the C' word of the corresponding rank. These hard decision bits are stored temporarily in an output buffer, or hard decision memory 45 (denoted HD_MEM in the figure), in principle (meaning in standard decoders) until they are overwritten by the hard decision bits resulting from decoding the next frame. The capacity of the memory 45 is equal to N, the size of an LDPC frame. The processor bank 42 can write to the memory 45 via a bus of P wires.

The elements 42, 43, 44 and 45 form a decoding unit of the decoder 52, here an LDPC decoding unit, which is configured for processing the data stored in the input memory 41.

In one embodiment, K=16200, N=64800, P=360, m=6 and t=6.

Figure 6:
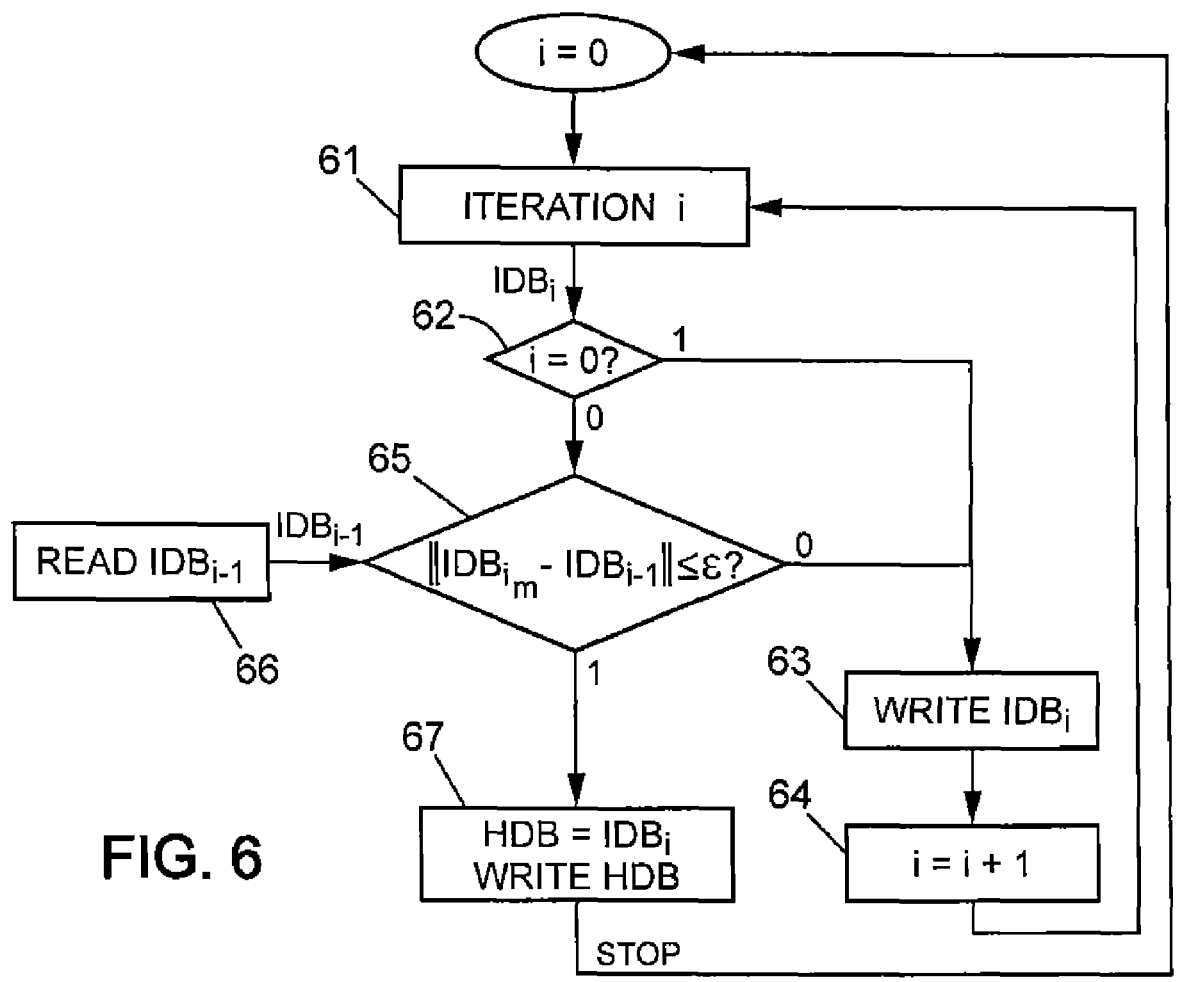
FIG. 6 is a flow diagram of one embodiment of the process according to the embodiments in FIG. 5, FIG. 7 and FIG. 8 are graphs showing examples of the total number of corrected errors for a block of bits processed in an iterative decoder, as a function of the number of iterations of the iterative decoding algorithm which have been executed, in accordance with various embodiments.

We will now describe a first embodiment of the iterative decoder, still with reference to FIG. 5, and also with reference to the flow diagram in FIG. 6.

In this first embodiment, the processor bank 42 delivers, in each iteration of the iterative decoding, a block of N intermediate decision bits (in N/P successive steps, by respective groups of P such bits each), which assume the values "1" or "0" depending on the sign of the sum of the columns of the H matrix and the LLRs for the C' word of the corresponding rank. This block of intermediate decision bits is stored temporarily in the output memory 45. More particularly, they are stored there for the duration of the next iteration in the iterative decoding algorithm, and are overwritten by the intermediate decision bits resulting from said next iteration. The purpose of storing the current block of intermediate decision bits is to use it as a block of reference bits in order to evaluate the stability of another block of intermediate decision bits generated during a later iteration of the decoding algorithm, for example the next iteration.

In FIG. 6, during a first iteration 61 (case where an index i is equal to 0) of the iterative decoding algorithm applied to a newly received frame, a block of intermediate decision bits is generated, denoted $IDB_i$. In step 62, the index i is tested to determine whether this is the first iteration of the algorithm. As this is indeed the case since i is equal to 0, the algorithm proceeds to step 63 ("WRITE $IDB_i$"), where the block of bits $IDB_i$ (where i=0) is written to the output memory 45. Then the index i is incremented by one (step 64), and the algorithm proceeds to the next iteration (step 61, where i≠0).

During any subsequent iteration (case where i≠0) of the decoding algorithm, the block $IDB_{i-1}$ of intermediate decision bits is read from the output memory 45 (step 66, "READ $IDB_i$") where it was stored during the previous iteration (meaning the iteration just before). The block $IDB_{i-1}$ of intermediate decision bits so read is provided as input to a comparison unit 46 (denoted "COMP" in FIG. 5), via a synchronization unit 47 (denoted "SYNC" in FIG. 5), as a block of reference bits.

During this same later iteration, the comparison unit 46 receives the current block of intermediate decision bits $IDB_i$, where these bits were generated by the processor bank 42 (and made available in successive groups of P such bits) by executing the current iteration of the decoding algorithm (steps 61 and 62 where i≠0).

The comparison unit 46 then compares (step 65, FIG. 6) the current block of intermediate decision bits $IDB_i$ and the previous block of intermediate decision bits $IDB_{i-1}$. This may be done as a bitwise comparison, for example, resulting in a calculation of the Hamming distance between the blocks compared. Based on the result of this calculation, it is determined whether a stability criterion for the block of intermediate decision bits has been satisfied. This criterion may be expressed by testing the relation $\|IDB_i - IDB_{i-1}\| < \epsilon$, where $\|IDB_i - IDB_{i-1}\|$ indicates the Hamming distance between the blocks of bits $IDB_i$ and $IDB_{i-1}$, and where $\epsilon$ is any threshold value.

If this relation is satisfied, the comparison unit generates a command or a STOP signal for stopping the iterative decoding algorithm (FIG. 5). The value of the $IDB_i$ block of intermediate decision bits is delivered as a block HDB of hard decision bits (step 67, FIG. 6). The HDB block is also stored in the output memory 45 ("WRITE HDB") by overwriting the $IDB_{i-1}$ block. Then the index i is reinitialized, meaning it is reset to zero (i=0), in order to process the data relative to the next LDPC frame received.

If the above relation is not satisfied, the $IDB_i$ block is stored in the output memory 45 (step 63), the index i is incremented by one (step 64), and a new iteration of the decoding algorithm is executed (return to step 61 with the value of i incremented).

One will note that the above relation may be an equality relation, where $\epsilon=0$. This gives preference in one embodiment to performance in terms of error correction rather than consumption.

The function of the delay unit 47 is to compensate for the difference between the respective delays which affect the current block of intermediate decision bits and the previous block of intermediate decision bits, at the input to the comparison unit 46. In the example represented, the synchronization unit 47 imposes a delay on the previous block of intermediate decision bits.

The stability criterion for the block of intermediate decision bits which is verified by the comparison unit 46 may, for example, involve a calculation of the Hamming distance as indicated above. For example, the criterion concerns the number of bits in the current block $IDB_i$ of intermediate decision bits which were corrected during the current iteration, in comparison to the block $IDB_{i-1}$ of intermediate decision bits issuing from the previous iteration. The stability criterion is considered to be satisfied, for example, if the number of bits thus corrected is less than the previously mentioned threshold $\epsilon$. In other words, if the Hamming distance between the compared blocks of bits is less than the threshold $\epsilon$, the stability criterion for the block of intermediate decision bits is considered to have been satisfied. But other "distances" may also be used.

Figure 7:
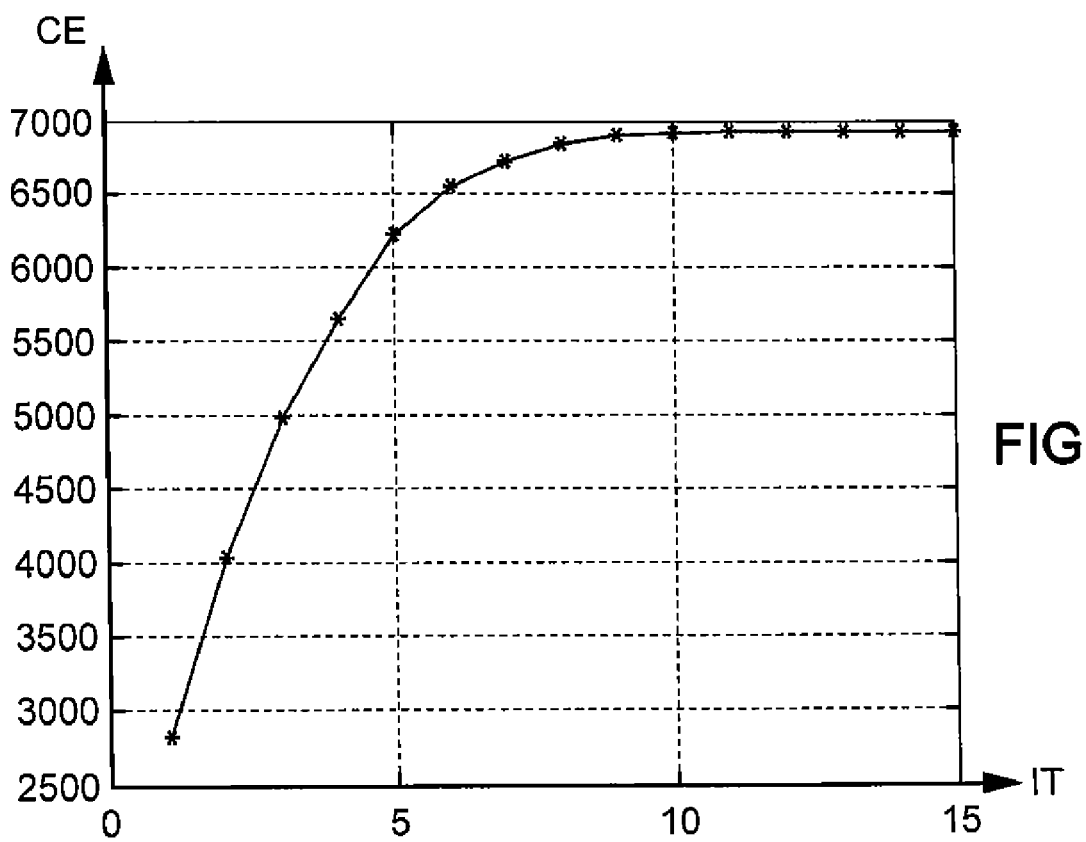

With reference to the example graph in FIG. 7, the previously described process allows stopping the iterative decoding algorithm as of the $11^{th}$ iteration. In this graph, the total number of corrected errors CE is represented as a function of the number IT of iterations of an LDPC-type iterative decoding algorithm which have been executed, for a QPSK modulated signal encoded using an LDPC code with code rate r=½ and sent with a signal-to-noise ratio SNR=2 dB.

Figure 8:
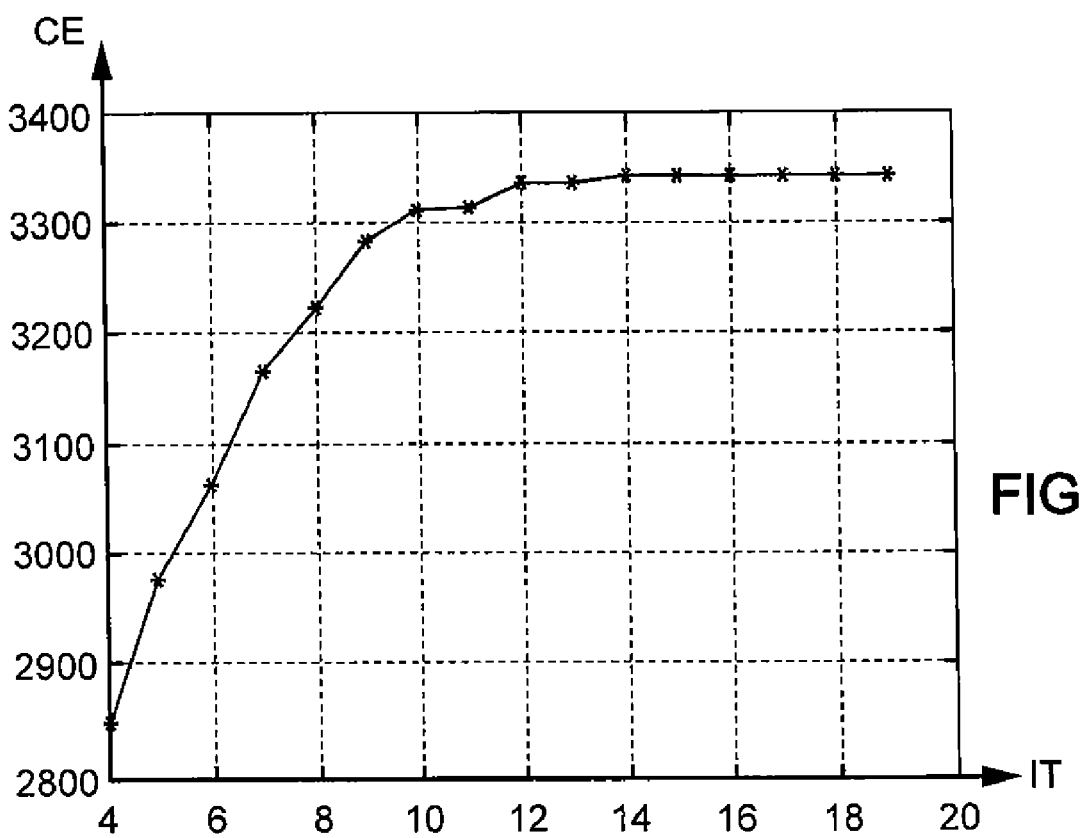

With reference to the example graph in FIG. 8, it may occur that the algorithm converges to a value for a block of intermediate decision bits where this value is not truly stable. Represented in this graph is the total number of corrected errors after each iteration of an LDPC-type iterative decoding algorithm, for a QPSK modulated signal encoded using an LDPC code with code rate r=¾ and sent with a signal-to-noise ratio SNR=4.2 dB. At the $11^{th}$ iteration (IT=11), the total number of corrected bits in the block of bits to be decoded is approximately identical to what it was in the $10^{th}$ iteration (IT=10), which was about 3310 corrected errors. Even so, the value of the obtained block of intermediate decision bits is not stable. In fact, at the $12^{th}$ iteration (IT=12), approximately 20 additional errors are corrected. Under these conditions, one can see that the error correction performance is penalized if execution of the iterative decoding algorithm is stopped at the $11^{th}$ iteration.

To mitigate this problem, in one embodiment, the comparison unit 46 generates the command or the STOP signal for stopping execution of the iterative decoding algorithm, if and only if the stability criterion is satisfied over a number Q of successive iterations, where Q is a whole number greater than or equal to one (Q≧1). One will note that the embodiment previously described is a special case of this embodiment, in which the number Q is equal to one (Q=1).

The embodiments in which Q>1 are advantageous, because they allow not stopping the execution of the iterative algorithm the moment the block of intermediate decision bits has approximately the same value as in the previous iteration, meaning the algorithm has converged to a given value of the block of intermediate decision bits, while this value is not truly stable. Of course, too high a value should not be chosen for Q, either, because then the reduction in power consumed by the decoder, which is part of the attraction of the method, would then be lost. A good compromise could lie in choosing Q=3, for example.

The comparison unit 46 and the synchronization unit 47 are purely functional, and in practice may be implemented as hardware and/or software.

In one advantage of the embodiments described above, the changing value of the block of intermediate decision bits which needs to be stored from one iteration to the next is saved in the output memory 45. Although normally intended for storing the block of hard decision bits only, in effect this memory can be used in this way according to some embodiments of the invention, by updating it at each iteration. And without needing to increase its size or the complexity of its management methods. In other words, the implementation of these embodiments does not require additional memory capacity, and the additional operations required are limited to generating blocks of intermediate decision bits, writing them to and reading them from the output memory, and operating the comparison unit 46 and the synchronization unit 47. These operations represent a calculation time and an energy consumption cost which is negligible considering the savings achieved by the reduction of the number of iterations in the iterative decoding algorithm.

In certain systems, however, the iterative decoder is followed by another decoder. For example, there are cases where two error corrector codes are concatenated. The DVB-S2 standard specifies the use of a BCH (Bose Chaudhuri Hocquenghem) code concatenated with an LDPC code. BCH codes were introduced in 1959 by A. Hocquenghem and in 1960 by R. C. Bose and D. K. Ray-Chaudhuri. These codes constitute a class of cyclic linear codes correcting multiple errors and based on the Hamming metric. They are considered as very powerful cyclic codes for correcting a series of random errors.

In such a system, the implementation of the embodiments of the invention which have been presented thus far may be problematic, requiring complex management in order to share the output memory of the LDPC decoder between this decoder and the BCH decoder.

Figure 9:
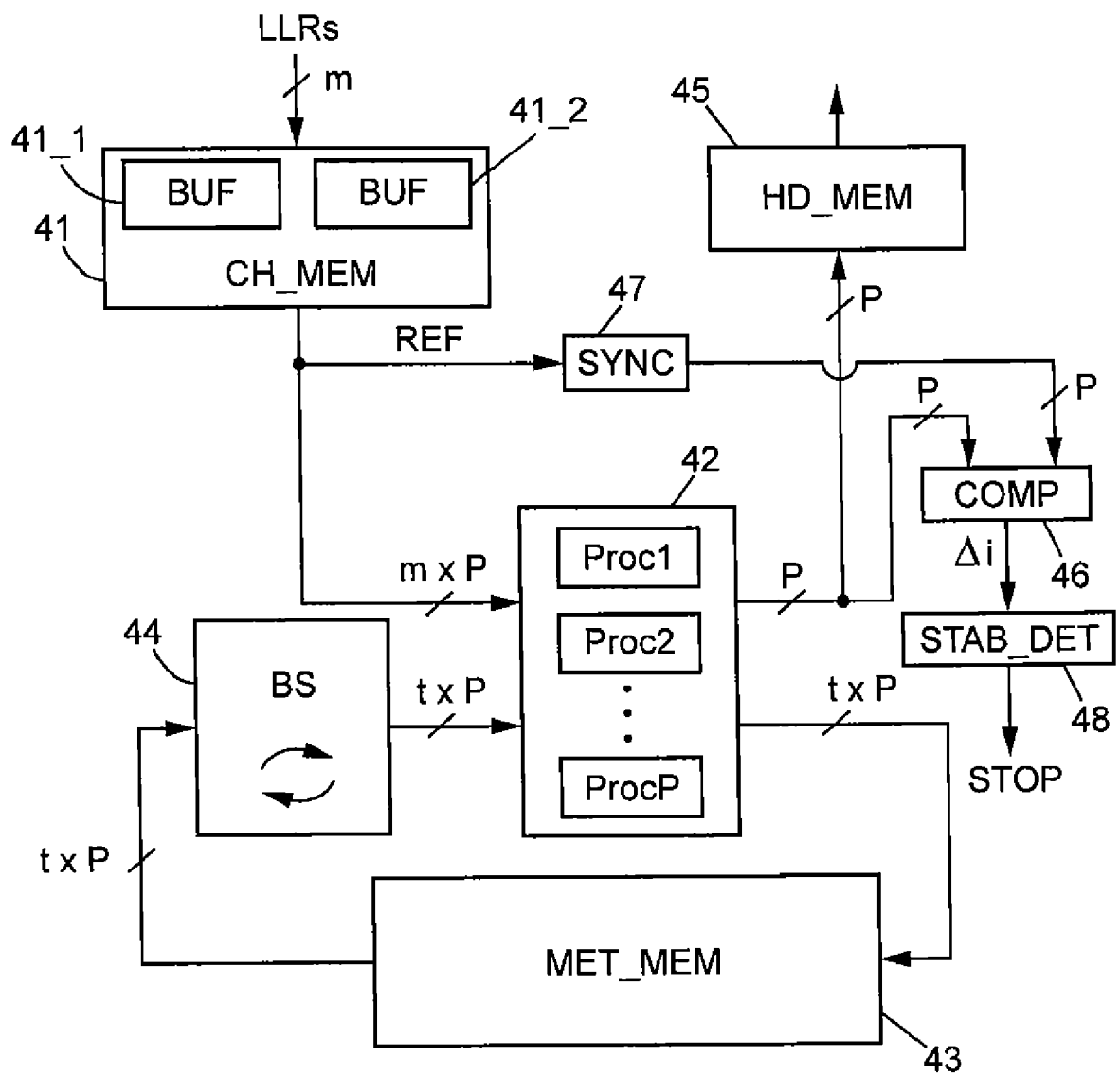
FIG. 9 is an architecture diagram of an iterative decoder according to other embodiments of the invention.
Figure 10:
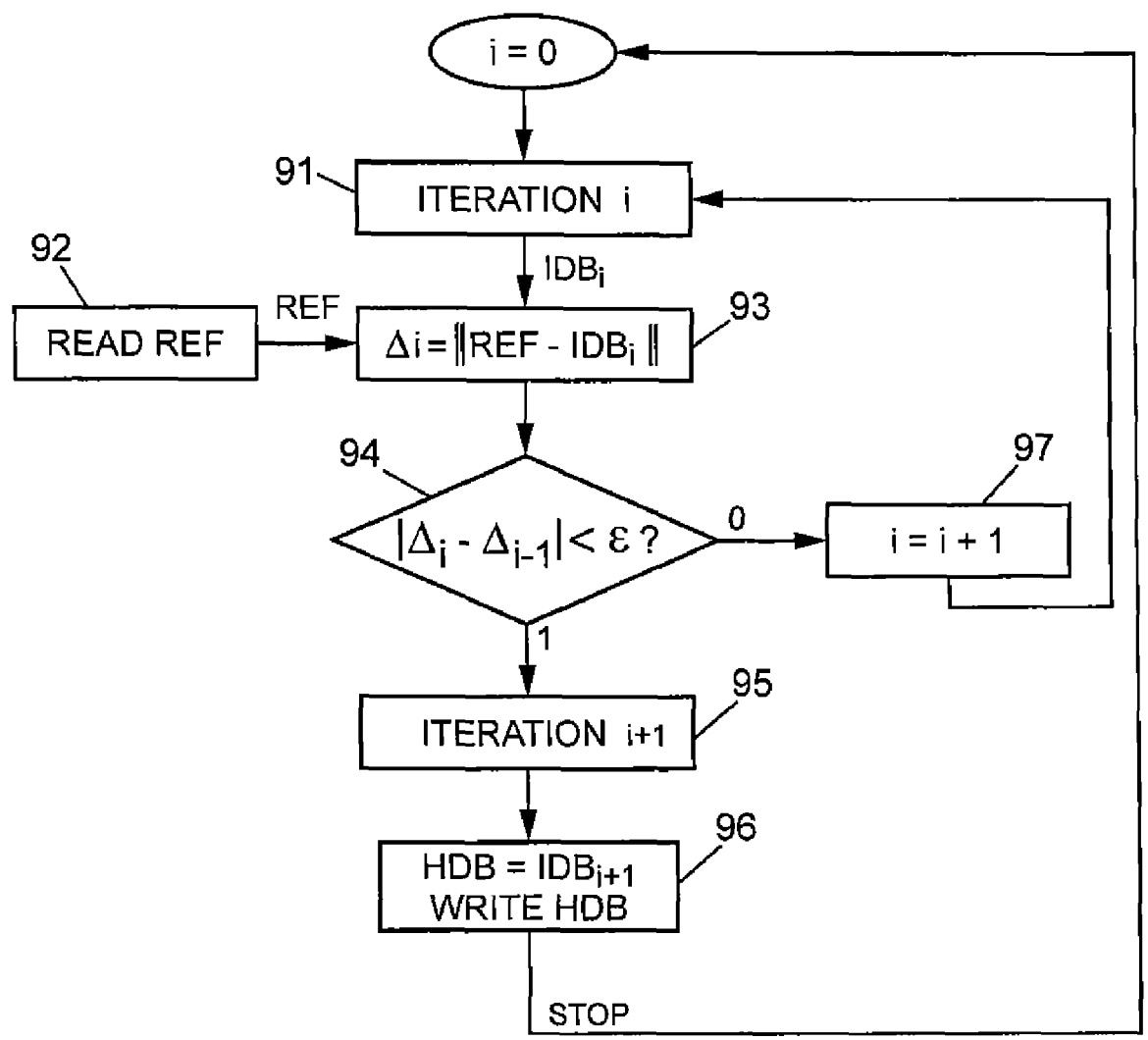
FIG. 10 is a flow diagram of one embodiment of the method according to the embodiments in FIG. 9.

This is why we will now describe a second embodiment of the iterative decoder, with reference to the diagram in FIG. 9 and the flow diagram in FIG. 10.

In this second embodiment, at each iteration of the iterative decoding algorithm, the processor bank 42 (FIG. 9) delivers a block $IDB_i$ of N intermediate decision bits (in N/P successive steps, by respective groups of P such bits each), which assume the value "1" or "0" depending on the sign of the sum of the columns of the H matrix and the LLRs for the C' word of the corresponding rank. This block of intermediate decision bits is not stored in the output memory 45 as was the case in the first embodiment. Stated otherwise, the output memory is used in the traditional manner here, for storing the hard decision bits, and is updated after each iteration of the iterative decoding algorithm.

Even so, each generated block $IDB_i$ of N intermediate decision bits is delivered by the processor bank 42 as input to the comparison unit 46. This unit also receives as input, via the synchronization unit 47, a block REF of N reference bits constructed from the respective sign bits of the N LLRs associated with the LDPC frame to be decoded, which are read from the input memory 41. In other words, the block of reference bits used at each iteration is read from the input memory of the decoder and based on the block of bits to be decoded.

In FIG. 10, the block of bits $IDB_i$ is generated during an iteration 91 other than the first iteration of the iterative decoding algorithm applied to a newly received frame (case where an index i≠0). In a step 92, the block REF is read from the input memory 41 and provided as input to the comparison unit 46. In step 93, this unit calculates a distance measurement $\Delta_i$, denoted $\|REF-IDB_i\|$, between the block REF of reference bits and the current block $IDB_i$ of intermediate decision bits. This distance may, for example, be a Hamming distance between these two blocks of bits. In this case, it corresponds to the total number of bits in the received LDPC frame which have been corrected since execution of the decoding algorithm began for this frame.

Then, in a step 94, the stability detection unit 48 compares the measurement $\Delta_i$ to the measurement $\Delta_{i-1}$ obtained in the previous iteration which was stored, for example, in the unit 48.

If the absolute value of this difference is less than a threshold value $\epsilon$, then the block of intermediate decision bits is considered to be stable. In other words, the stability criterion for the block of intermediate decision bits is satisfied if the distance between this block of bits and the block of reference bits does not vary by a number above the threshold $\epsilon$. In this case, at the end of a new iteration of index i+1 (step 95), the stability detection unit 48 generates the command or the STOP signal for stopping execution of the iterative decoding algorithm. The value of the block $IDB_{i+1}$ of intermediate decision bits is delivered as a block HDB of hard decision bits (step 96). The HDB block is stored in the output memory 45 ("WRITE HDB") by overwriting the block of hard decision bits corresponding to the previous LDPC frame. Then the index i is reinitialized in order to process the data relative to the next LDPC frame received.

If the relation $|\Delta_i-\Delta_{i-1}|<\epsilon$ is not satisfied, the index i is incremented by one (step 97), and a new iteration of the decoding algorithm is executed (return to step 91 with the value of i incremented).

One will note that, in the second embodiment as in the first embodiment, the above relation may be an equality relation where $\epsilon=0$. In such case, in principle this is the same as saying that the stability criterion is satisfied when no more new errors are corrected between the index i−1 iteration and the index i iteration. In fact, however, if $|\Delta_i-\Delta_{i-1}|=0$, this does not mean that no new errors were corrected between iteration i−1 and iteration I, because bits may be wrongly correctly while errors are being corrected, and these two effects may offset each other. A breakdown of frames into subframes may be used to minimize this phenomenon.

One will also note, again in this second embodiment, that the stability criterion can be considered as satisfied only if it is satisfied in a number Q of successive iterations.

Advantageously in one embodiment, an aforesaid stability criterion can be verified for a number S of LDPC subframes, rather than for complete LDPC frames. Here an LDPC subframe means a subdivision (by bits) of an LDBC frame. For example, the stability criterion can be said to be satisfied for the complete frame if it is cumulatively satisfied for each subframe. Worded more generally, the stability criterion is a complex criterion, verified cumulatively for subblocks of the block of bits to be decoded. In practice it has been observed that such a stability criterion is more robust.

The invention has been described above in preferred but non-limiting embodiments. In particular, the invention is not limited by the type of block decoding. The decoding algorithms are also not limiting; in particular an iterative decoding algorithm other than an LDPC decoding algorithm may be envisaged in one or more embodiments.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for an iterative decoding of a block of bits having a number N of bits to be decoded where N is a whole number greater than or equal to two, said method being implemented by a decoder having an output memory and using an iterative decoding algorithm, with said method comprising:
   a) generating a current block of N intermediate decision bits by executing an iteration of the iterative decoding algorithm, followed by:
   b) verifying a stability criterion for said current block, evaluated over a number Q of prior iterations of the iterative decoding algorithm where Q is a whole number greater than or equal to one, including comparing the current block with at least one given block of N reference bits read from the output memory of the decoder, wherein the block of reference bits is a previous intermediate decision block generated during a previous iteration of the iterative decoding algorithm; and
   c) if the stability criterion is satisfied, stopping iterations of the iterative decoding algorithm and delivering the current block of intermediate decision bits as a block of hard decision bits,
   d) if the stability criterion is not satisfied, returning to a).

2. The method according to claim 1 wherein the block of intermediate decision bits after b), or the block of hard decision bits in c), are saved to the output memory of the decoder by overwriting a previous block of intermediate decision bits saved during a previous iteration of the algorithm.

3. The method according to claim 1 wherein the iterative decoding algorithm is an LDPC decoding algorithm.

4. The method of claim 1 wherein Q is greater than 1.

5. An iterative decoding device for iteratively decoding a block of bits having a number N of bits to be decoded where N is a whole number greater than or equal to two, the device comprising:
   at least one of an input memory or an output memory;
   means for executing an iterative decoding algorithm;
   means for generating a current block of N intermediate decision bits by executing an iteration of the iterative decoding algorithm;
   means for verifying a stability criterion for said current block, evaluated over a number Q of prior iterations of the iterative decoding algorithm where Q is a whole number greater than or equal to one, including means for comparing the current block with at least one given block of N reference bits read from the input memory or the output memory, wherein the block of reference bits used by the means for verifying is a block of N bits, each corresponding to a sign of a likelihood value respectively associated with one of the N bits of the block of bits to be decoded; and
   means, if the stability criterion is satisfied, for stopping iterations of the iterative decoding algorithm and for delivering the current block of intermediate decision bits as a block of hard decision bits, and for otherwise continuing generation of a subsequent current block of N intermediate decision bits.

6. A method for an iterative decoding of a block of bits having a number N of bits to be decoded where N is a whole number greater than or equal to two, said method being implemented by a decoder having an input memory and using an iterative decoding algorithm, with said method comprising:
   a) generating a current block of N intermediate decision bits by executing an iteration of the iterative decoding algorithm, followed by:
   b) verifying a stability criterion for said current block, evaluated over a number Q of prior iterations of the iterative decoding algorithm where Q is a whole number greater than or equal to one, including comparing the current block with at least one block of reference bits based on the block of bits being decoded and read from the input memory of the decoder, wherein the block of reference bits is a block of N bits, each corresponding to a sign of a likelihood value respectively associated with one of the N bits of the block of bits to be decoded; and
   c) if the stability criterion is satisfied, stopping iterations of the iterative decoding algorithm and delivering the current block of intermediate decision bits as a block of hard decision bits,
   d) if the stability criterion is not satisfied, returning to a).

7. The method according to claim 6 wherein the likelihood value is a log-likelihood ratio.

8. The method according to claim 6 wherein the stability criterion is a complex criterion, verified cumulatively for subblocks of the block of bits to be decoded.

9. The method according to claim 6 wherein the iterative decoding algorithm is an LDPC decoding algorithm.

10. The method of claim 6 wherein Q is greater than 1.

11. An iterative decoding device for iteratively decoding a block of bits having a number N of bits to be decoded where N is a whole number greater than or equal to two, the device comprising:
   an output memory;
   means for executing an iterative decoding algorithm;
   means for generating a current block of N intermediate decision bits by executing an iteration of the iterative decoding algorithm;
   means for verifying a stability criterion for said current block, evaluated over a number Q of prior iterations of the iterative decoding algorithm where Q is a whole number greater than or equal to one, including means for comparing the current block with at least one given block of N reference bits read from the input memory or the output memory;
   means, if the stability criterion is satisfied, for stopping iterations of the iterative decoding algorithm and for delivering the current block of intermediate decision bits as a block of hard decision bits, and for otherwise continuing generation of a subsequent current block of N intermediate decision bits; and
   means for reading from the output memory bits of a previous intermediate decision block, which were generated during a previous iteration of the iterative decoding algorithm, said previous intermediate decision block being usable as the block of reference bits by the means for verifying.

12. The device of claim 11 wherein the means for executing the iterative decoding algorithm includes means for executing an LDPC decoding algorithm.

13. The device of claim 11 wherein the stability criterion is a complex criterion, the means for verifying including means for cumulatively verifying the complex criterion for subblocks of the block of bits to be decoded.

14. An iterative decoding device for iteratively decoding a block of bits having a number N of bits to be decoded where N is a whole number greater than or equal to two, the device comprising:
- an output memory;
- means for executing an iterative decoding algorithm;
- means for generating a current block of N intermediate decision bits by executing an iteration of the iterative decoding algorithm;
- means for verifying a stability criterion for said current block, evaluated over a number Q of prior iterations of the iterative decoding algorithm where Q is a whole number greater than or equal to one, including means for comparing the current block with at least one given block of N reference bits read from the input memory or the output memory;
- means, if the stability criterion is satisfied, for stopping iterations of the iterative decoding algorithm and for delivering the current block of intermediate decision bits as a block of hard decision bits, and for otherwise continuing generation of a subsequent current block of N intermediate decision bits; and
- means for saving the block of intermediate decision bits or the block of hard decision bits to the output memory by overwriting a previous block of intermediate decision bits saved during a previous iteration of the algorithm.

15. The device of claim 14 wherein the iterative decoding algorithm is an LDPC decoding algorithm.

16. The device of claim 14 wherein Q is greater than 1.

17. The device of claim 5 wherein Q is greater than 1.

18. The device of claim 5 wherein the likelihood value is a log-likelihood ratio.

19. The device of claim 5 wherein the stability criterion is a complex criterion, verified cumulatively for subblocks of the block of bits to be decoded.

20. An article of manufacture, comprising:
- a machine-readable medium having instructions stored thereon for iterative decoding of a block of bits having a number N of bits to be decoded where N is a whole number greater than or equal to two, said instructions being executable by a processor of a decoder having an output memory and adapted to use an iterative decoding algorithm, said instructions stored on said machine-readable medium including instructions to:
  a) generate a current block of N intermediate decision bits by executing an iteration of the iterative decoding algorithm;
  b) verify a stability criterion for said current block, evaluated over a number Q of prior iterations of the iterative decoding algorithm where Q is a whole number greater than or equal to one, including instructions to compare the current block with at least one block of N reference bits of a previous intermediate decision block generated during a previous iteration of the iterative decoding algorithm and read from the output memory of the decoder; and
  c) if the stability criterion is satisfied, stop iterations of the iterative decoding algorithm, and deliver the current block of intermediate decision bits as a block of hard decision bits, if the stability criterion is not satisfied, continue to generate a subsequent current block of intermediate decision bits according to a).

21. The article of manufacture of claim 20 wherein the instructions to generate the current block of intermediate decision bits by executing an iteration of the iterative decoding algorithm includes instructions to execute an LDPC decoding algorithm.

22. The article of manufacture of claim 20 wherein the machine-readable medium further includes instructions stored thereon to save the block of intermediate decision bits or the block of hard decision bits in the output memory by overwriting a previous block of intermediate decision bits saved during a previous iteration of the algorithm.

23. An article of manufacture, comprising:
- a machine-readable medium having instructions stored thereon for iterative decoding of a block of bits having a number N of bits to be decoded where N is a whole number greater than or equal to two, said instructions being executable by a processor of a decoder having an input memory and/or an output memory and adapted to use an iterative decoding algorithm, said instructions stored on said machine-readable medium including instructions to:
  a) generate a current block of N intermediate decision bits by executing an iteration of the iterative decoding algorithm;
  b) verify a stability criterion for said current block, evaluated over a number Q of prior iterations of the iterative decoding algorithm where Q is a whole number greater than or equal to one, including instructions to compare the current block with at least one block of N reference bits read from the input memory or the output memory of the decoder, each of the N bits of the reference block corresponding to a sign of a likelihood value respectively associated with one of the N bits of the block of bits to be decoded; and
  c) if the stability criterion is satisfied, stop iterations of the iterative decoding algorithm, and deliver the current block of intermediate decision bits as a block of hard decision bits, if the stability criterion is not satisfied, continue to generate a subsequent current block of intermediate decision bits according to a).

24. The article of manufacture of claim 23 wherein the iterative decoding algorithm is an LDPC decoding algorithm.

25. The article of manufacture of claim 23 wherein Q is greater than 1.

26. The article of manufacture of claim 23 wherein the likelihood value is a log-likelihood ratio.

27. A system to iteratively decode a block of bits having a number N of bits to be decoded where N is a whole number greater than or equal to two, the system comprising:
- a decoder adapted to use an iterative decoding algorithm, the decoder including:
  at least one processor to generate a current block of intermediate decision bits in response to execution of an iteration of the iterative decoding algorithm;
  a comparison unit coupled to the processor to verify a stability criterion of the current block of intermediate decision bits based on a comparison of the intermediate decision bits of the current block with reference bits;
  an output memory coupled to the processor to receive the current block of decision bits and to deliver the current block of decision bits as a block of hard decision bits if the stability criterion is met, wherein otherwise a next iteration of the iterative decoding algorithm is executed to generate a next current block of intermediate decision bits; and
  a metric memory coupled to the processor to store updated metrics generated by the processor during iterations of said iterative decoding algorithm; and
  a mixer coupled to the metric memory and to the processor to provide the stored metrics to the processor to update.

28. The system according to claim 27 wherein the output memory is coupled between the processor and the comparison circuit, wherein the reference bits include intermediate decision bits of a previous current block that were generated by the processor and were stored in the output memory and were retrieved therefrom by the comparison circuit to verify the stability criterion.

29. The system according to claim 27 wherein the comparison circuit is adapted to verify the stability criterion for said current block based on a single one of said iterations of the iterative decoding algorithm.

30. The system according to claim 27 wherein the comparison circuit is adapted to verify the stability criterion for said current block based a plurality of said iterations of the iterative decoding algorithm.

31. The system according to claim 30 wherein said reference bits comprise at least some of the bits of the block to be decoded, and wherein said comparison circuit is coupled to directly receive the intermediate decision bits of the current block from the processor to compare with said at least some of the bits of the block to be decoded.

32. The system according to claim 27 wherein said decoder includes an iterative LDPC decoding device.

33. The system according to claim 27 wherein the decoder is part of a satellite transmission receiver.

34. The system according to claim 27, further comprising an input memory coupled to the processor to provide the block of bits to be decoded.

35. A device, comprising:
an iteratively decoding block configured to generate blocks of N intermediate decision bits during iterations of decoding a block of N bits, where N is a whole number greater than or equal to two;
a verification unit configured to determine whether a stability criterion is satisfied over a number Q of successive iterations of decoding based on one or more comparisons of current blocks of intermediate decision bits with previous blocks of intermediate decision bits, where Q is a number greater than or equal to one; and
an output memory configured to provide the verification block with the previous blocks of intermediate decision bits, to replace a previous block of intermediate decision bits with a current block of intermediate decision bits after each comparison, and to output the current block of decision bits as a block of hard decision bits when the stability criterion is satisfied, wherein the iterative decoding block is configured to stop iterations of decoding of the block of N bits when the reliability criterion is satisfied.

36. The device of claim 35 wherein Q is greater than 1.

37. The device of claim 35 wherein the stability criterion is further based on whether a threshold number of iterations of decoding the block of N bits has been exceeded, wherein the stability criterion is satisfied when the threshold number of iterations has been exceeded.

38. The device of claim 35 wherein the iterative decoding block includes an iterative LDPC decoder.

39. A device, comprising:
an iteratively decoding block configured to generate blocks of N intermediate decision bits during iterations of decoding a block of N bits, where N is a whole number greater than or equal to two;
a verification unit configured to determine whether a stability criterion is satisfied over a number Q of successive iterations of decoding based on one or more comparisons of current blocks of intermediate decision bits with reference blocks of N bits, where Q is a number greater than or equal to one and the bits of a reference block each correspond to a sign of a likelihood value respectively associated with one of the N bits of the block of bits to be decoded; and
an output configured to deliver a current block of decision bits as a block of hard decision bits when the stability criterion is satisfied, wherein the iterative decoding block is configured to stop iterations of decoding of the block of N bits when the reliability criterion is satisfied.

40. The device of claim 39 wherein Q is greater than 1.

41. The device of claim 39 wherein the stability criterion is further based on whether a threshold number of iterations of decoding the block of N bits has been exceeded, wherein the stability criterion is satisfied when the threshold number of iterations has been exceeded.

42. The device of claim 39 wherein the likelihood value is a log-likelihood ratio.

* * * * *